(12) United States Patent
Winkler et al.

(10) Patent No.: US 11,239,043 B2
(45) Date of Patent: Feb. 1, 2022

(54) CHARGED PARTICLE BEAM DEVICE AND METHOD FOR INSPECTING AND/OR IMAGING A SAMPLE

(71) Applicant: ICT Integrated Circuit Testing Gesellschaft für Halbleiterprüftechnik mbH, Heimstetten (DE)

(72) Inventors: Dieter Winkler, Munich (DE); Bernd Wöllert, Markt Schwaben (DE); Birgit Schabinger, Poing (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/878,271

(22) Filed: May 19, 2020

(65) Prior Publication Data
US 2021/0366683 A1 Nov. 25, 2021

(51) Int. Cl.
*H01J 37/145* (2006.01)
*H01J 37/244* (2006.01)
(Continued)

(52) U.S. Cl.
CPC .......... *H01J 37/145* (2013.01); *H01J 37/244* (2013.01); *H01J 37/28* (2013.01);
(Continued)

(58) Field of Classification Search
CPC ...... H01J 37/244; H01J 37/28; H01J 37/1474; H01J 37/20; H01J 2237/24475; H01J 2237/0475
See application file for complete search history.

(56) References Cited

U.S. PATENT DOCUMENTS 6,407,387 B1 6/2002 Frosien et al.
6,407,388 B1 6/2002 Frosien
(Continued)

OTHER PUBLICATIONS

Invitation to Pay Additional Fees and, where applicable, protest fee for Application No. PCT/EP2021/055856, dated Jun. 9, 2021, 15 pages.
(Continued)

*Primary Examiner* — David A Vanore
(74) *Attorney, Agent, or Firm* — Kilpatrick Townsend & Stockton LLP

(57) ABSTRACT

A charged particle beam device for imaging and/or inspecting a sample is described. The charged particle beam device includes a beam emitter for emitting a primary charged particle beam; a retarding field device for retarding the primary beam before impinging on the sample, the retarding field device including an objective lens and a proxy electrode; and a first detector for off-axial backscattered particles between the proxy electrode and the objective lens. The charged particle beam device is adapted for guiding the primary beam along an optical axis to the sample for releasing signal particles. The proxy electrode includes one opening allowing a passage of the primary charged particle beam and of the signal particles, wherein the one opening is sized to allow a passage of charged particles backscattered from the sample at angles from 0° to 20° or above relative to the optical axis. Further, a method for imaging and/or inspecting a sample with a charged particle beam device is described.

20 Claims, 4 Drawing Sheets

(51) Int. Cl.
  *H01J 37/28* (2006.01)
  *H01J 37/32* (2006.01)
(52) U.S. Cl.
  CPC . *H01J 37/32568* (2013.01); *H01J 2237/0492* (2013.01); *H01J 2237/2448* (2013.01); *H01J 2237/2817* (2013.01)

(56) References Cited

U.S. PATENT DOCUMENTS

| | | | | |
|---|---|---|---|---|
| 8,785,879 | B1* | 7/2014 | Frosien | H01J 37/28 250/396 ML |
| 9,035,249 | B1* | 5/2015 | Frosien | H01J 37/1474 250/310 |
| 9,589,763 | B1* | 3/2017 | Frosien | H01J 37/285 |
| 9,601,303 | B2* | 3/2017 | Frosien | H01J 37/244 |
| 2003/0001095 | A1* | 1/2003 | Lo | H01J 37/3177 250/346 |
| 2006/0163480 | A1* | 7/2006 | Koyama | G01R 31/311 250/310 |
| 2008/0283747 | A1 | 11/2008 | Kawamata et al. | |
| 2008/0315094 | A1* | 12/2008 | Wang | H01J 37/244 250/310 |
| 2009/0039264 | A1* | 2/2009 | Ikegami | H01J 37/28 250/311 |
| 2010/0065753 | A1* | 3/2010 | Enyama | H01J 37/1472 250/397 |
| 2013/0292568 | A1* | 11/2013 | Bizen | H01J 37/244 250/307 |
| 2014/0361167 | A1* | 12/2014 | Morishita | H01J 37/28 250/310 |
| 2016/0217968 | A1* | 7/2016 | Li | H01J 37/1477 |
| 2016/0372304 | A1* | 12/2016 | Masnaghetti | H01J 37/244 |
| 2017/0047192 | A1* | 2/2017 | Frosien | H01J 37/28 |
| 2018/0358199 | A1* | 12/2018 | Kumamoto | H01J 37/28 |
| 2019/0378682 | A1* | 12/2019 | Wang | H01L 31/085 |
| 2021/0110994 | A1* | 4/2021 | Li | H01J 37/244 |

OTHER PUBLICATIONS

International Search Report and Written Opinion for Application No. PCT/EP2021/055856, dated Aug. 3, 2021, 21 pages.
Invitation to Pay Additional Fees and, where Applicable, Protest Fee for Application No. PCT/EP2021/055854, dated Jun. 14, 2021, 16 pages.
U.S. Appl. No. 14/825,055 Non-Final Office Action dated Jul. 21, 2016, 7 pages.
U.S. Appl. No. 14/825,055 Notice of Allowance dated Nov. 10, 2016, 9 pages.
U.S. Appl. No. 16/878,193 First Action Interview Pilot Program Pre-Interview Communication dated Jul. 9, 2021, 6 pages.
International Search Report and Written Opinion for Application No. PCT/EP2021/055854, dated Aug. 4, 2021, 24 pages.
U.S. Appl. No. 16/878,193 Notice of Allowance dated Aug. 25, 2021, 11 pages.
U.S. Appl. No. 16/878,193 Corrected Notice of Allowability dated Sep. 2, 2021, 2 pages.
U.S. Appl. No. 16/878,193 Corrected Notice of Allowability dated Sep. 3, 2021, 4 pages.

* cited by examiner

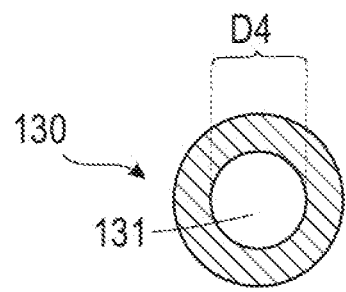
Fig. 3
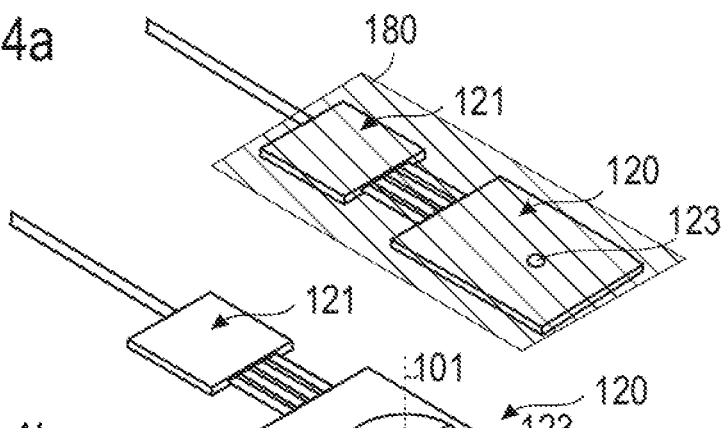

CHARGED PARTICLE BEAM DEVICE AND METHOD FOR INSPECTING AND/OR IMAGING A SAMPLE

TECHNICAL FIELD

Embodiments described herein relate to devices for imaging and/or inspecting a sample with one or more charged particle beams, particularly electron beams. Specifically, charged particle beam devices with a retarding field device are described, configured to decelerate the charged particle beam before impingement on the sample. Embodiments particularly relate to an electron beam inspection system for inspecting a sample with 3D-structures or structures with a high aspect ratio by detecting backscattered electrons (BSEs). Embodiments further relate to a method for inspecting and/or imaging a sample with a charged particle beam device.

BACKGROUND

Charged particle beam apparatuses have many functions in a plurality of industrial fields including, but not limited to, critical dimensioning of semiconductor devices during manufacturing, defect review of semiconductor devices, inspection of semiconductor devices, exposure systems for lithography, detecting devices and testing systems. Thus, there is a high demand for structuring, testing and inspecting specimens or samples on the micrometer and nanometer scale.

Micrometer and nanometer scale process control, inspection or structuring is often done with charged particle beams, e.g. electron beams, which are generated and focused in charged particle beam devices, such as electron microscopes. Charged particle beams offer superior spatial resolution compared to, e.g., photon beams due to their short wavelengths.

In recent years, it is becoming more and more interesting to inspect and/or image samples with 3D structures or structures having large aspect ratios (such as large ratios of depth to opening width). Devices like 3D FinFETs and 3D NANDs have structures with large aspect ratios which are difficult to image in scanning electron microscopes (SEMs) when using secondary electrons (SEs), i.e. low energy signal electrons generated when the primary electron beam hits the sample surface. SEs can hardly escape from structures having high aspect ratios and can often not be detected with a reasonable signal to noise ratio. In particular, critical dimension (CD) measurements of high aspect ratio trenches and contact holes is a challenge. Image modes which use backscattered electrons (BSEs), i.e. higher-energy electrons backscattered from the sample, are often used for increasing the quality of imaging and/or inspection, especially in the semiconductor industry.

In modern charged particle beam inspection systems, it would be beneficial to detect both secondary charged particles and backscattered charged particles with a high detection efficiency. This would allow an accurate inspection of both the sample surface extending essentially in an x-y-plane and of 3D-structures having a depth in the z-direction with a high resolution. In some systems, backscattered charged particles which leave the sample at various angles relative to the optical axis are predominantly detected with a first detector arranged close to the sample, e.g., between the objective lens and the sample. On the other hand, secondary charged particles are predominantly detected with a second detector arranged at a larger distance from the sample, e.g. between the beam source and the objective lens. However, obtaining a high BSE-detection efficiently without considerably reducing the detection efficiency of lower-energy signal charged particles is difficult to achieve.

In view of the above, it would be beneficial to provide a charged particle beam device and a method for inspecting and/or imaging a sample that overcome at least some of the problems in the art.

SUMMARY

In light of the above, charged particle beam devices and methods for inspecting and/or imaging a sample with charged particle beam devices according to the independent claims are provided. Further aspects, advantages, and features are apparent from the dependent claims, the description, and the accompanying drawings.

According to one aspect, a charged particle beam device for imaging and/or inspecting a sample is provided. The charged particle beam device includes: a beam emitter for emitting a primary charged particle beam, the charged particle beam device adapted for guiding the primary charged particle beam along an optical axis to the sample for releasing signal particles; a retarding field device for retarding the primary charged particle beam before impinging on the sample, the retarding field device including an objective lens and a proxy electrode; and a first detector for off-axial backscattered particles between the proxy electrode and the objective lens. The proxy electrode has one opening allowing a passage of the primary charged particle beam and of the signal particles, wherein the one opening is sized to allow a passage of charged particles backscattered from the sample at angles (a) from 0° to 20° or above relative to the optical axis.

Further described is a charged particle beam device for imaging and/or inspecting a sample. The charged particle beam device includes: a beam emitter for emitting a primary charged particle beam, the charged particle beam device adapted for guiding the primary charged particle beam along an optical axis to the sample for releasing signal particles; a retarding field device for retarding the primary charged particle beam before impinging on the sample, the retarding field device including an objective lens and a proxy electrode, wherein the proxy electrode includes an opening allowing a passage of the primary charged particle beam and of the signal particles; a first detector for off-axial backscattered particles between the proxy electrode and the objective lens; and a pre-amplifier for amplifying a signal of the first detector, wherein the pre-amplifier is at least one of (i) integrated with the first detector, (ii) arranged adjacent to the first detector inside a vacuum housing of the charged particle beam device, and (iii) fixedly mounted in a vacuum chamber of the charged particle beam device.

According to another aspect, a charged particle beam device for imaging and/or inspecting a sample is provided. The charged particle beam device includes: a beam emitter for emitting a primary charged particle beam, the charged particle beam device adapted for guiding the primary charged particle beam along an optical axis to the sample for releasing signal particles; a retarding field device for retarding the primary charged particle beam before impinging on the sample, the retarding field device including an objective lens and a proxy electrode, wherein the proxy electrode includes an opening allowing a passage of the primary charged particle beam and of the signal particles; and a first detector for off-axial backscattered particles between the proxy electrode and the objective lens, wherein the first detector is configured to act as a further electrode for influencing the primary charged particle beam and includes at least one of a conductive inner surface directed toward the optical axis and a conductive top surface directed toward the objective lens and configured to be set on a predetermined potential.

In some embodiments, the charged particle beam device is an electron microscope, particularly a scanning electron microscope (SEM) with one or more scan deflectors for scanning the primary charged particle beam over a surface of the sample in a predetermined scanning pattern.

According to one aspect, a method for imaging and/or inspecting a sample with a charged particle beam device is provided. The method includes: emitting a primary charged particle beam; guiding the primary charged particle beam along an optical axis to the sample for generating signal particles; focusing and retarding the primary charged particle beam with a retarding field device that includes an objective lens and a proxy electrode arranged between the objective lens and the sample, wherein the proxy electrode has one opening allowing a passage of the primary charged particle beam and of the signal particles, wherein the one opening is sized to allow a passage of charged particles backscattered from the sample at angles (a) from 0° to 20° or above relative to the optical axis; and detecting off-axial backscattered particles with a first detector arranged between the proxy electrode and the objective lens.

Further described is a method for imaging and/or inspecting a sample with a charged particle beam device. The method includes: emitting a primary charged particle beam; guiding the primary charged particle beam along an optical axis to the sample for generating signal particles; focusing and retarding the primary charged particle beam with a retarding field device that includes an objective lens and a proxy electrode arranged between the objective lens and the sample; detecting off-axial backscattered particles with a first detector arranged between the proxy electrode and the objective lens; and pre-amplifying a signal of the first detector with a pre-amplifier mounted adjacent to the first detector in a vacuum environment inside the charged particle beam device.

Embodiments are also directed at apparatuses for carrying out the disclosed methods and include apparatus parts for performing each described method feature. The method features may be performed by way of hardware components, a computer programmed by appropriate software, by any combination of the two or in any other manner. Furthermore, embodiments are also directed at methods of manufacturing the described apparatuses and method of operating the described apparatuses. It includes method features for carrying out every function of the apparatus.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to embodiments of the disclosure and are described in the following:

FIG. 3 shows a proxy electrode for a charged particle beam device in a top view according to embodiments described herein;

FIGS. 4a to 4b show a first detector of a charged particle beam device described herein in a perspective bottom view and in a perspective top view;

DETAILED DESCRIPTION OF EMBODIMENTS

Reference will now be made in detail to the various embodiments, one or more examples of which are illustrated in the figures. Within the following description, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as an electron beam device configured for the detection of signal electrons. The signal electrons particularly encompass secondary electrons and/or backscattered electrons, specifically both secondary and backscattered electrons (SEs and BSEs). However, it is to be understood that embodiments described herein can be applied for apparatuses and components detecting other corpuscles such as secondary and/or backscattered charged particles in the form of ions in order to obtain a sample image or inspection result. Accordingly, in embodiments described herein, charged particles are not limited to electrons.

A "specimen", "sample" or "wafer" as referred to herein includes, but is not limited to, semiconductor wafers, semiconductor workpieces, and other workpieces such as memory disks and the like. A "sample" may specifically be any workpiece that is structured or on which material is deposited. A specimen, a sample or wafer may include a surface that is to be inspected and/or imaged, e.g. a surface that is structured or on which layers or a material pattern have been deposited. For example, a sample may be a substrate or a wafer on which a plurality of electronic devices is provided that are to be inspected. According to some embodiments, the devices and methods described herein relate to electron beam inspection (EBI), critical dimension measurement and defect review applications, where the devices and methods described herein can be beneficially used to obtain an increased throughput and an improved detection accuracy. According to some embodiments, an electron beam inspection (EBI), critical dimension measurement (CD) tool, and/or defect review (DR) tool can be provided, wherein high resolution, large field of view, and high scanning speed can be achieved.

Figure 1:
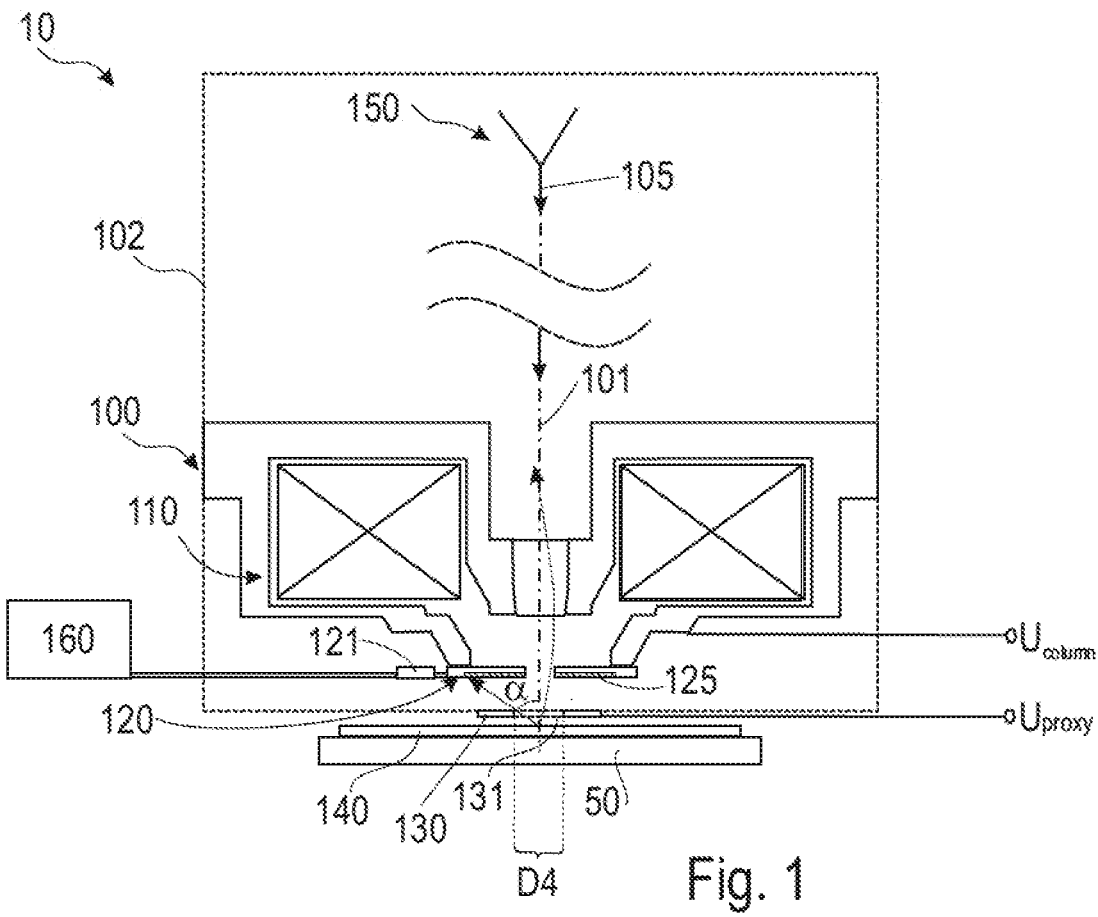
FIG. 1 is a schematic view of a charged particle beam device according to embodiments described herein.

FIG. 1 shows a schematic view of a charged particle beam device 10 for imaging and/or inspecting a sample according to embodiments described herein. The charged particle beam device 10 includes a beam emitter 150 for emitting a primary charged particle beam, particularly an electron beam. The charged particle beam device 10 is configured to guide the primary charged particle beam 105 along an optical axis 101 to a sample 140 for releasing signal particles from the sample. The sample 140 may be placed on a sample stage 50, the sample stage 50 including a sample support surface extending essentially in an x-y-plane.

The beam emitter 150 may be a cold field emitter (CFE), a Schottky emitter, a TFE, or a high current and/or high brightness charged particle source, particularly an electron source. A high current is considered to be 5 µA in 100 mrad or above.

The charged particle beam device 10 further includes a retarding field device 100 for retarding the primary charged particle beam 105 before impingement on the sample 140, the retarding field device 100 including an objective lens 110 and a proxy electrode 130. A "proxy electrode" as used herein may be understood as an electrode arranged in proximity to the sample, specifically between the objective lens 110 and the sample 140 (or the sample stage 50). In other words, the proxy electrode 130 is arranged downstream of the objective lens 110 in the propagation direction of the primary charged particle beam 105, and is typically the last electrode that is passed by the primary charged particle beam before hitting the sample surface. For example, a distance D1 (see FIG. 2) between the proxy electrode 130 and the sample 140 during operation may be 5 mm or less, particularly 3 mm or less, more particularly 1 mm or less, or even 200 µm or less.

According to some embodiments described herein, the charged particle beam device is adapted for guiding the primary beam in a column of the charged particle beam device along the optical axis 101 to the sample for generating signal particles released from the sample, the signal particles including secondary particles generated upon impingement and backscattered particles reflected from the sample. The proxy electrode 130 includes one opening 131 allowing a passage of the primary charged particle beam 105 toward the sample and allowing a passage of the signal particles in an opposite direction coming from the sample through the one opening 131. Typically, the one opening 131 is aligned with the optical axis 101. Specifically, the optical axis 101 of the charged particle beam device may centrally intersect the one opening 131 of the proxy electrode 130.

Generally, the primary charged particle beam 105 travels through the column of the charged particle beam device before hitting the sample to be imaged and/or inspected. An interior of the column may be evacuated, i.e., the charged particle beam device typically includes a vacuum housing 102 such that the primary charged particle beam propagates through an environment having sub-atmospheric pressure, e.g. a pressure of 1 mbar or less, particularly $1 \times 10^{-5}$ mbar or less, or even $1 \times 10^{-8}$ mbar or less (ultra-high vacuum). The beam emitter and the objective lens may be arranged inside the vacuum housing 102 of the charged particle beam device. The proxy electrode 130 may be provided adjacent to a front end of the vacuum housing 102 and/or may protrude into a sample chamber where the sample stage is provided. The sample chamber may be configured for a sub-atmospheric pressure (e.g., a high vacuum), whereas the vacuum housing 102 of the charged particle beam device may be configured for an ultra-high vacuum in some embodiments.

When the primary charged particle beam 105 impinges on the sample, different reactions occur on or in the sample. For instance, secondary particles are released from the sample: The primary beam impinging on the sample dissociates other particles in the sample, in particular by the energy provided by the particles of the primary charged particle beam. These secondary particles, after being released from the sample, leave the sample and can be detected by a suitable detector. But the primary charged particle beam causes a further effect: the particles of the primary beam bounce off from the sample (either from the surface or after entering into the sample to a certain depth) and are reflected from the sample. The particles of the primary charged particle beam bouncing off the sample and leaving the sample are denoted as backscattered particles. The backscattered particles can be detected at various backscattered angles for obtaining spatial information about the sample. Typically, the secondary particles and the backscattered particles are together referred to as signal particles or signal electrons.

The detection of backscattered electrons is particularly beneficial for the imaging and inspection of 3-D structures in the semiconductor industry. For instance, devices like 3D FinFETs and 3D NANDs have structures with large aspect ratios which are difficult to image in charged particle beam devices using the secondary particles only. A large aspect ratio may be understood as a ratio of the depth of the structure in the sample to the opening width of the structure being about 5:1 or higher, such as 10:1 or even 20:1 or higher. In a simplified example, the structure may be a substantially cylindrical hole in the sample, providing a depth into the sample and a width corresponding approximately to the diameter of the substantially cylindrical hole, as will be explained in more detail below.

Secondary particles, such as secondary electrons, cannot easily escape from the large aspect ratio structures and can typically not be detected with reasonable signal to noise ratio. In particular, CD-measurements of high aspect ratio trenches and contact holes is a challenge. However, in embodiments described herein, backscattered particles can be used for imaging and/or inspecting structures with large aspect ratios. Backscattered particles can leave holes and trenches because the backscattered particles have enough energy to escape from deep structures, and it may not be necessary to use high extraction fields for extracting backscattered particles from the sample (which is different from secondary electrons). Further, under suitable (moderate) landing energies of the primary beam, the backscattered particles can pass through side walls and can leave the sample, such that a larger number of backscattered particles can contribute to the overall backscattered particles signal. Efficient backscattered particles detectors are beneficially used that can detect small-angle backscattered particles (reflected from high aspect ratio features) as well as large-angle backscattered particles which have passed through surrounding materials.

In known devices, proxy electrodes with several openings are used: A central opening for signal particles leaving the sample at small angles relative to the optical axis and at least one further opening for signal particles (off-axial BSEs) leaving the sample at large angles relative to the optical axis. However, a proxy electrode with a plurality of openings for signal particles propagating at different angles may reduce the overall detection efficiency.

In view of the above, embodiments described herein include a proxy electrode 130 with one opening 131 that is sized to allow a passage of charged particles backscattered from the sample at angles α from 0° to 20° or above relative to the optical axis 101. In particular, the proxy electrode may only have one single opening instead of a plurality of openings. Specifically, as described herein, the following particles propagate through the same opening of the proxy electrode: (a) the primary charged particle beam, (b) "axial" signal particles including secondary particles and backscattered particles leaving the sample essentially along the optical axis (e.g., at angles between 0° and 5° relative to the optical axis), and (c) "off-axial" signal particles leaving the sample at larger angles relative to the optical axis (e.g., at angles between 5° and 20°), including large-angle backscattered electrons propagating at angles of more than 15° relative to the optical axis. Accordingly, essentially no signal particles that carry valuable information about the sample are blocked by the body of the proxy electrode, and both small-angle backscattered particles and large-angle backscattered particles can be detected downstream of the proxy electrodes in a propagation direction of the signal particles, after having passed through the same opening 131 of the proxy electrode.

In some embodiments, which can be combined with other embodiments described herein, the one opening 131 of the proxy electrode 130 is sized to allow a passage of charged particles backscattered from the sample at angles α from 0° to 45° or above, or even at angles from 0° to 65° or above relative to the optical axis. Accordingly, also signal particles backscattered from the sample at very large angles relative to the optical axis can propagate through the one opening 131 of the proxy electrode 130 without a risk of being blocked by the body of the proxy electrode. This increases the detection efficiently of the signal particles, particularly of off-axial backscattered particles that carry valuable information about structures on the sample.

In some embodiments, the one opening 131 of the proxy electrode 130 is around or a circular opening that may be centrally intersected by the optical axis 101. In some implementations, the proxy electrode is arranged very close to the sample surface during the operation of the charged particle beam device, e.g. at a first distance D1 (see FIG. 2) of 5 mm or less, particularly 3 mm or less, more particularly 1 mm or less, or even 200 μm or less. A small first distance D1 allows also large-angle backscattered electrons to propagate through the one opening 131. On the other hand, the first distance D1 is typically at least 100 μm, such that it is still possible to extract signal electrons from the sample by providing an extraction region between the sample and the proxy electrode. Alternatively or additionally, a diameter D4 of the one opening 131 may be 1 mm or more, particularly 3 mm or more, or even 5 mm or more. A large diameter D4 of the one opening 131 allows also large-angle backscattered electrons to propagate through the one opening 131. On the other hand, the diameter D4 of the one opening may be 8 mm or less, such that a predetermined electric field can be generated in the extraction region between the sample and the one opening 131 of the proxy electrode by applying a predetermined electric potential $U_{proxy}$ to the proxy electrode.

The charged particle beam device further includes a first detector 120 for off-axial backscattered particles, wherein the first detector 120 is arranged between the proxy electrode 130 and the objective lens 110. "Off-axial backscattered particles" are particles backscattered at an angle relative to the optical axis, e.g. at an angle of 5° or more. Accordingly, the off-axial backscattered electrons (which typically have a particle energy of several keV or several tens of keV) can be detected by the first detector 120 at a position directly downstream of the proxy electrode 130 in the propagation direction of the backscattered electrons. This increases the detection efficiency for off-axial backscattered particles.

For example, the first detector 120 may be a backscattered electron detector, particularly a semiconductor detector, particularly a PIN diode. In particular, the first detector 120 may be a multi-channel backscattered electron detector including a plurality of detection segments whose signals can be individually processed, e.g., individually mixed and/or combined. For example, the signals from the plurality of detection segments can be combined for compositional imaging and/or individually processed for improving the topographic contrast.

Optionally, a second detector (not shown in FIG. 1) configured to detect further signal particles released from the sample, particularly secondary charged particles and/or axial backscattered electrons that are backscattered essentially along the optical axis or at small angles, may be arranged downstream of the objective lens in the travelling direction of the signal particles. The second detector may be a secondary electron detector. Accordingly, the secondary charged particles and/or the axially backscattered particles propagating essentially along the optical axis can be detected by the second detector at a position between the objective lens and the beam emitter.

In some embodiments, the first detector 120 may be a backscattered electron detector, particularly an in-lens detector with a detection surface 125 that may extend annularly around the optical axis 101. In some embodiments, the first detector 120 is an in-lens detector with a hole that allows a passage of the primary charged particle beam 105 and that has an annular detection surface surrounding the hole.

In some implementations, the detection surface 125 of the first detector 120 may be sized for detecting at least charged particles backscattered from the sample at angles between 15° and 30° relative to the optical axis, particularly at angles between 10° and 35°, more particularly between 7° and 40°, or an even larger range of angles. For example, as is exemplarily shown in FIG. 2, the first detector 120 may have a detection surface 125 sized for detecting charged particles backscattered from the sample in a range between a first angle (α1) of 15° or less and a second angle (α2) of 30° or more. Axially backscattered particles and particles backscattered at very small angles relative to the optical axis (e.g., angles of 5° or less) may propagate through the hole of the first detector and are not detected by the first detector. Axially backscattered particles may optionally be detected by a second detector downstream of the objective lens in the propagation direction of the signal particles. Charged particles backscattered at very large angles relative to the optical axis (e.g., angles of 35° or more, or 45° or more) may hit a support of the first detector radially outside of the detection surface 125 of the first detector without being detected, or may already be blocked by the body of the proxy electrode 130. In some embodiments, the size of the one opening 131 of the proxy electrode 130 may be adapted to the size of the detection surface 125 of the first detector, such that charged particles backscattered at very large angles that would hit the first detector radially outside of the detection surface are blocked by the proxy electrode.

In some embodiments, which can be combined with other embodiments described herein, the retarding field device 100 includes an electrostatic-magnetic objective lens (or a magnetic objective lens) and the proxy electrode 130. Generally, in a retarding field device, the electron energy inside the column is reduced to the final landing energy before impingement on the sample. The overall performance of the retarding field device may be determined by the immersion factor which is the ratio of the column energy to the landing energy. The higher the immersion factor, the better the performance is in terms of resolution.

In some embodiments, the retarding field device 100 is adapted for generating an extraction field for the secondary particles released from the sample. For instance, the retarding field device 100 acting as a retarding lens for the primary charged particle beam may act as an accelerating lens for the secondary particles emitted by the sample. The retarding field device may be controlled so as to adjust the operational parameters for the purpose of decelerating the primary charged particle beam and accelerating the secondary particles. For low landing energies, the focal power of the retarding field device is based on the combinatory effects of the objective lens and the proxy electrode that retard the primary electrons before impingement.

In the context of embodiments described herein, a retarding field device for a charged particle beam device describes a device for acting on a charged particle beam with an initially high electron energy that is decelerated to a lower landing energy shortly before striking the sample. The ratio between the electron energy in the column after acceleration and the landing energy before impingement on the sample can be about 4 or more, e.g. 8 or more. The landing energy can be 10 keV or less, e.g. 5 keV or less, such as 1 keV.

According to some embodiments, the proxy electrode may be understood as the beam influencing electrode closest to the sample or the sample stage. In an example, the distance between the proxy electrode and the sample stage or the sample is smaller than the distance between the objective lens and the sample stage or the sample.

According to embodiments described herein, enabling a detection of large-angle backscattered particles with reduced detection losses is achieved by using the proxy electrode having the one opening 131 as an entrance window for the backscattered particle detection. The proxy electrode can further be used for decelerating the primary charged particle beam as a final component of the retarding field device. The proxy electrode may further be able to control the extraction field strength for the secondary particles.

Since the retarding field device provides a significant potential difference between sample and column of the charged particle beam device of typically 5 keV or more, 15 keV or even 30 keV or more, e.g. about 35 keV, backscattered particles passing through the one opening 131 are accelerated before reaching the first detector 120 which is advantageous for high efficiency detection. The first detector 120 may act as an acceleration electrode and be set on a respective potential. Accelerating the backscattered particles is in particular beneficial when detecting backscattered particles at a low landing energy (e.g. of below 10 keV, e.g. below 3 keV or even 1 keV) or when backscattered particles have lost a part of their energy when travelling through the sample material. In the case that the column is on ground potential, detection with semiconductor detectors like pin diodes may be practicable to realize because the detector as well as the detector electronics may be set on a ground potential.

Figure 2:
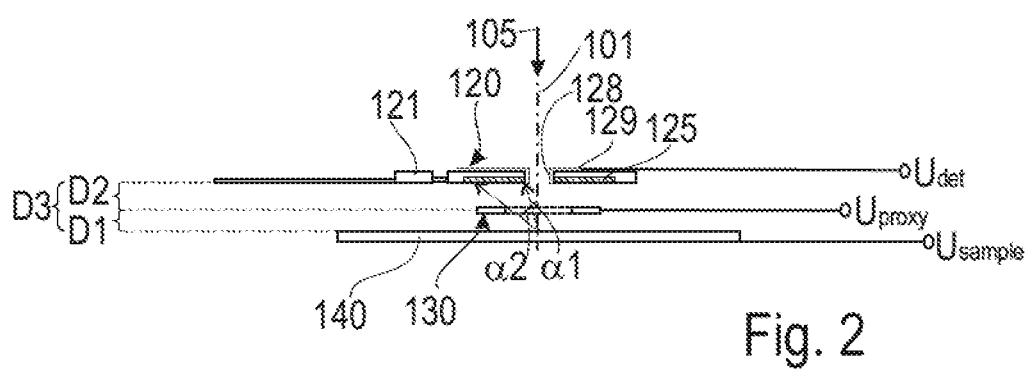
FIG. 2 is an enlarged view of the proxy electrode and the first detector of the charged particle beam device of FIG. 1.

FIG. 2 is an enlarged sectional view of the proxy electrode 130 and the first detector 120 of a charged particle beam device according to embodiments described herein. FIG. 3 shows the proxy electrode 130 in a schematic top view, and FIGS. 4a and 4b show the first detector 120 in schematic top and bottom views.

As is shown in FIG. 2 and FIG. 3, the proxy electrode 130 that is the electrode closest to the sample stage has one opening 131 allowing a passage of the primary charged particle beam 105 and of the signal particles, wherein the one opening 131 is sized to allow a passage of charged particles backscattered from the sample at angles from 0° to 20° or above relative to the optical axis 101. In particular, the one opening 131 may be a round opening having a diameter D4 of 3 mm or more, particularly 4 mm or more, or even 6 mm or more. Accordingly, essentially all the signal electrons that carry valuable information about the sample, including off-axial backscattered electrons and secondary electrons propagating essentially axially, may propagate through the same opening of the proxy electrode. The off-axial backscattered electrons propagate toward the first detector 120 for being detected and/or the secondary electrons propagate toward an optional second detector for being detected. The first detector 120 that is configured for detecting the off-axial backscattered electrons is arranged between the proxy electrode and the objective lens.

The first detector 120 may be an in-lens detector with a detection surface 125 sized to detect off-axial backscattered electrons backscattered in an angular range between a first angle ($\alpha 1$) of 15° (or less) and a second angle ($\alpha 2$) of 30° (or more), particularly in an angular range between a first angle ($\alpha 1$) of 10° (or less) and a second angle ($\alpha 2$) of 35° (or more). The detection surface 125 may be essentially annularly shaped.

The detection surface 125 is shown in FIG. 4b in further detail. FIG. 4 shows the first detector 120 in a perspective view from below, i.e. as viewed from the sample: The detection surface 125 may be annular and may extend around a hole 123 that is provided in the first detector, e.g. centrally in the detection surface 125. The primary charged particle beam and axial signal particles can propagate through the hole 123 in opposite directions. In some implementations, the detection surface 125 may be segmented and may include a plurality of detection segments 126, particularly two or more detection segments, more particularly four or more detection segments. At least two detection segments may be provided for detecting signal particles in different angular ranges relative to the optical axis, such as a first angular range from 10° to 20° and a second angular range from 20° to 30°, wherein these values are to be understood as examples. Specifically, the detection segments may be provided to cover at least two different radial ranges relative to the optical axis 101, as is schematically depicted in FIG. 4b. Alternatively or additionally, at least two detection segments may be provided for detecting different azimuthal ranges. For example, a first detection segment may have the shape of a ring section (e.g., a first ring section covering 180°), and a second detection segment may have the shape of another ring section (e.g., a second ring section covering the remaining 180°, as is schematically depicted in FIG. 4b). More than two ring sections may be provided in some embodiments, e.g., segments for top, bottom, left, and right, i.e. four ring sections extending over 90°, respectively. Each detector segment can detect a defined portion of the signal particles (e.g., polar and/or azimuthal) and thus create topographic contrast. The contrast is mainly caused by shadowing on the declined sides of topographic features. By providing several detection segments covering different azimuthal ranges, the topographic contrast can be increased and three-dimensional features can be inspected and/or images with an improved accuracy and/or resolution. In the embodiment shown in FIG. 4b, four detection segments are provided for covering two different radial and two different azimuthal ranges.

In some embodiments, the hole 123 of the first detector 120 may have a diameter of 1.5 mm or more, particularly 2 mm or more. Alternatively or additionally, the hole 123 may have a diameter of 10 mm or less, particularly 6 mm or less. Specifically, the hole 123 may have a diameter from 2 mm to 5 mm. A small diameter increases the detection efficiency of backscattered charged particles by the first detector, but may also increase the risk of instabilities, e.g. due to charging or contamination of the first detector. A large diameter decreases the detection efficiency for backscattered particles but reduces instabilities, e.g. because the primary charged particle beam can be guided through the hole at a distance from the hole edge. Alternatively or additionally, the detection surface 125 of the first detector 120 may have a diameter of 12 mm or more and/or 20 mm or less, particularly about 15 mm.

In some implementations, a second distance D2 between the proxy electrode 130 and the first detector 120 is 3 mm or more and/or 6 mm or less, particularly 4 mm or more and/or 5 mm or less. A small second distance D2 increases the risk of instabilities, e.g. the risk of arcing, but may provide a more compact retarding field device, increasing the obtainable resolution. A large second distance facilitates the accommodation of the first detector and reduces the risk of instabilities, but may lead to a less compact device with a reduced resolution.

In some implementations, a third distance D3 between the sample and the first detector may be 3 mm or more and/or 12 mm or less, particularly 4 mm or more and 10 mm or less. A third distance D3 in the above range provides a good obtainable resolution in combination with a good topographic contrast.

In some embodiments, which can be combined with other embodiments described herein, the first detector 120 is configured to act as a further electrode 122 (provided in addition to the proxy electrode 130) that is arranged between the objective lens and the proxy electrode 130 and is configured for influencing the primary charged particle beam and/or the signal particles. Specifically, the first detector 120 may be configured to be set on a predetermined potential $U_{det}$ in order to influence the primary charged particle beam propagating through the hole of the first detector 120 and/or in order to influence the signal particles propagating through the one opening 131. The proxy electrode may also be referred to as a "lower electrode" and the first detector may also be referred to as an "upper electrode" herein.

In some embodiments, the further electrode 122 provided by the first detector 120 is configured to be set on the predetermined potential $U_{det}$ via a respective voltage connection. Specifically, the further electrode 122 may be configured to be set on a ground potential which may correspond to a column potential of the charged particle beam device and/or which may be different from the potential $U_{proxy}$ of the proxy electrode and/or different from the potential $U_{sample}$ of the sample.

Specifically, in some embodiments, the further electrode 122 and/or the column may be set on a ground potential during the operation of the device, and the proxy electrode 130 and/or the sample 140 may be set on a high-voltage potential of, e.g. between 3 keV and 35 keV. The voltage difference between the further electrode 122 and the proxy electrode 130 may decelerate the primary charged particle beam before impingement on the sample and/or may accelerate signal particles coming through the one opening of the proxy electrode.

In some implementations, the first detector 120 includes a conductive surface configured to be set on the predetermined electric potential $U_{det}$. For example, the first detector may include a housing or support made of a conductive material or may be at least partially coated with a conductive material, e.g. metallized. The conductive surface may include at least one of a conductive inner surface 128 that is directed toward the optical axis 101 and a conductive top surface 129 that is directed toward the objective lens, i.e. directed in an upstream direction of the primary charged particle beam. The conductive surface of the first detector may be set on a ground potential that may correspond to the column potential of the charged particle beam device. Accordingly, the first detector 120 or at least a conductive part thereof may act as one of the electrodes of a magnetic-electrostatic objective lens, particularly in combination with the proxy electrode 130, to decelerate the primary charged particle beam between the first detector 120 and the proxy electrode, and/or to accelerate the signal particles between the proxy electrode and the first detector. For example, a surface, support or housing of the first detector may be made of a conductive material or may comprise a conductive material, e.g. via metallization, such that the first detector can be set on the predetermined electric potential $U_{det}$.

In some implementations, a potential difference may be applied between the proxy electrode 130 and a column of the charged particle beam device, such as to decelerate the primary charged particle beam before impingement on the sample. The potential difference may be 3 keV or more and/or 50 keV or less, particularly 10 keV or more and 35 keV or less. In particular, a potential difference between the proxy electrode 130 and a column of the charged particle beam device that is set on a predetermined electric potential $U_{column}$ may be between 3 keV and 35 keV (see FIG. 1).

When the first detector 120 acts as the further electrode 122, the first detector 120 may be set essentially on the potential of the column. Particularly, the first detector 120 may be grounded. A potential difference between the proxy electrode 130 and the first detector acting as the further electrode may be 3 keV or more and 35 keV or less.

By using the first detector 120 as an electrode of a magnetic-electrostatic objective lens device, another electrode can be saved and a more compact retarding field device can be provided in combination with the proxy electrode. Specifically, the objective lens 110 may be a magnetic or electrostatic objective lens, and the objective lens 110 in combination with the first detector 120 acting as an upper electrode and the proxy electrode 130 acting as a lower electrode may provide a magnetic-electrostatic retarding objective lens device. Specifically, the objective lens can be arranged closer to the sample, increasing the obtainable resolution, because it may not be necessary to provide two electrodes in addition to the first detector in a range downstream of the objective lens 110. Further, a defined deceleration path for the primary charged particle beam can be provided in a range between the first detector 120 and the proxy electrode 130.

It is particularly beneficial to combine the aspect of the proxy electrode 130 with the one opening as described herein with the aspect of the first detector 120 acting as a further electrode as described herein. Due to the high detection efficiency and the improved resolution resulting from the compact retarding field device in which the first detector acts as an electrode, three-dimensional features can be inspected with a high accuracy and high contrast.

Even if the first detector 120 acting as the further electrode 122 is beneficially used in combination with the proxy electrode 130 with the one opening 131 as described herein, the first detector 120 acting as the further electrode 122 is also described herein as an independent aspect. Specifically, a charged particle beam device as described herein may include a first detector 120 for off-axial backscattered particles arranged between a proxy electrode and an objective lens. The first detector is configured to act as a further electrode for influencing the primary charged particle beam and/or the signal particles and includes a conductive surface configured to be set on a predetermined potential $U_{det}$. The conductive surface may include at least one of a conductive inner surface directed toward the optical axis and a conductive top surface directed toward the objective lens. In some embodiments, the further electrode 122 can be connected to a ground potential during an operation of the device. Specifically, the further electrode 122 may be set on a predetermined electric potential corresponding to the column potential of the device.

In some embodiments, which can be combined with other embodiments described herein, the beam emitter 150 is adapted for emitting a primary electron beam, and the charged particle beam device includes electron beam optical devices for guiding the primary electron beam along the optical axis 101 to the sample for generating secondary electrons and backscattered electrons. The charged particle beam device may further include a sample stage 50 for supporting the sample 140 to be inspected.

In particular, embodiments herein may relate to a scanning electron microscope with a charged particle beam device as described herein. In such a charged particle beam device, the beam emitter is an electron source configured to emit a primary electron beam, and the scanning electron microscope further includes a scan deflector for scanning the primary electron over a surface of the sample in a predetermined scanning pattern, the sample being supported on a sample stage.

According to a further aspect, which may be applied to any of the embodiments described herein and which is described herein as an independent aspect that may be combined with other features described herein, the charged particle beam device includes a pre-amplifier 121 for amplifying a signal of the first detector 120. In some implementations, the pre-amplifier 121 may be an electronic amplifier, particularly an operational amplifier. In some embodiments, the first detector 120 may be a solid-state or semiconductor detector, particularly including a PIN diode. The first detector 120 may provide an electric signal that is pre-amplified by the pre-amplifier. The pre-amplified signal may then be forwarded to a signal amplification module and/or a signal evaluation module, e.g. a signal amplification and evaluation module 160 as schematically depicted in FIG. 1. The signal amplification module is optional and may further amplify the pre-amplified signal before evaluation. Alternatively, the pre-amplified signal may be directly evaluated. In some embodiments, the pre-amplifier is arranged in a vacuum housing of the charged particle beam device, particularly in the column directly at the objective lens, and the pre-amplified signal provided by the pre-amplifier is further amplified by a main amplifier arranged outside vacuum.

If the first detector 120 is a multi-channel backscattered electron detector including a plurality of detection segments 126, the pre-amplifier 121 may be a multi-channel preamplifier. For example, the first detector 120 includes four (or more) detection segments and the pre-amplifier 121 includes a 4-channel (or >4-channel) amplifier for pre-amplifying the signals of the four detection segments.

In some embodiments, which can be combined with other embodiments described herein, the pre-amplifier 120 is at least one of integrated with the first detector 120, arranged adjacent to the first detector 120 in a vacuum housing of the charged particle beam device (e.g., inside the vacuum housing provided by the column, e.g. mounted at the objective lens or at a magnetic part of the objective lens), and fixedly mounted inside a vacuum housing of the charged particle beam device (e.g., fixedly mounted inside the column, e.g. mounted at the objective lens or at a magnetic part of the objective lens). More specifically, the first detector 120 may be connected to the pre-amplifier 121 inside the vacuum housing of the charged particle beam device and may be fixedly mounted at a position close to the first detector which is likewise fixedly mounted. For example, a distance between a detection surface of the first detector and the pre-amplifier may be 3 cm or less. In some embodiments, the first detector and the pre-amplifier may be mounted at the objective lens, e.g. at a downstream end of the magnetic part of the objective lens.

In some embodiments, the first detector 120 includes a support 180, e.g. a plate or housing, on which the pre-amplifier 121 is fixedly mounted. The support 180 of the first detector 180 may be arranged adjacent to a downstream end of the column of the charged particle beam device, e.g. fixed at the objective lens 110. For example, the first detector 120 and the pre-amplifier 121 may be provided as one integrated detector module including the pre-amplifier integrated with the first detector on the common support 180 of the first detector 120 (as is depicted in FIG. 4a) or even on a single chip. In some embodiments, a detector module including a support supporting both the detector surface 125 and the pre-amplifier 121 at a close distance (e.g., 3 cm or less) is provided.

Arranging the pre-amplifier close to the first detector, particularly inside the vacuum housing of the charged particle beam device (e.g., inside the column), and/or integrating the pre-amplifier with the first detector to provide an integrated detector module is beneficial because the detection speed and the detection efficiency can be increased. Fixedly mounting the pre-amplifier at a position close to the first detector, e.g., on the support 180 or at the objective lens, further improves the signal to noise ratio and improves the detection efficiency. For example, increased signal intensities can be achieved by mounting the pre-amplifier at a position close to the first detector. This may enable very fast imaging speeds with high scan rates of, e.g., 50 MHz or faster, or even up to 100 MHz.

The first detector 120 may provide a high collection efficiency, e.g., down to electron energies of 1 keV, and/or may provide a low signal capacitance, e.g., down to 3 pF. In some embodiments, the detector module including the first detector and the pre-amplifier may be compact, e.g., may have a thickness of 2 mm or less, particularly 1.5 mm or less, in the direction of the optical axis.

As described herein, it is beneficial to combine the aspect of the proxy electrode 130 having the one opening 131 and the aspect of the pre-amplifier 121 being integrally mounted with or being arranged adjacent to the first detector 120. Combining these two aspects enables an increased collection efficiency of off-axially backscattered particles, since essentially all relevant signal particles may arrive at the first detector 121 and are directly and quickly pre-amplified, further increasing the collection efficiency and improving the signal to noise ratio. In addition, the above two aspects are beneficially combined with the third aspects described herein related to the usage of the first detector 120 as a further (upper) electrode, provided in addition to the proxy electrode 131 (lower electrode). Using the first detector 120 as a further electrode provides a more compact arrangement of components downstream of the objective lens, and hence further increases the collection efficiency. Combining the above three aspects therefore provides a charged particle beam device that enables a low noise signal detection of off-axially backscattered particles at a broad range of energies and combines this with imaging at high speeds. Accordingly, three-dimensional structures can be quickly and reliably inspected with a high accuracy and good topographic contrast.

It is however to be noted that the aspect of a pre-amplifier 121 for amplifying the signal of the first detector 120, as described herein, can be applied independently of the other two aspects to a charged particle beam device. Accordingly, embodiments described herein also relate to charged particle beam devices for imaging and/or inspecting a sample with the following features: a beam emitter 150 for emitting a primary charged particle beam, the charged particle beam device adapted for guiding the primary charged particle beam along an optical axis to the sample for releasing signal particles; a retarding field device 100 for retarding the primary charged particle beam before impinging on the sample, the retarding field device comprising an objective lens 110 and a proxy electrode 130, wherein the proxy electrode comprises an opening allowing a passage of the primary charged particle beam and of the signal particles; a first detector for off-axial backscattered particles between the proxy electrode and the objective lens; and a pre-amplifier for amplifying a signal of the first detector.

The pre-amplifier 121 as described herein is at least one of (a) integrated with the first detector, (b) arranged adjacent to the first detector in a vacuum housing of the charged particle beam device (particularly inside the column, e.g. mounted at the objective lens together with the first detector), and (c) fixedly mounted in the vacuum housing of the charged particle beam device, particularly fixedly mounted together with the first detector at the objective lens or integrated with the objective lens, e.g. with the magnetic part of the objective lens). An integration of the pre-amplifier with the first detector may include a support 180 of the first detector 120 on which the pre-amplifier is mounted, e.g. fixedly mounted. The support 180 may be a plate that is provided at a position downstream of the objective lens, or the support may be mounted at a downstream end of the objective lens. The support may carry both the detection surface 125 of the first detector and the pre-amplifier. An integration may alternatively include one single chip bearing both the detection surface and the pre-amplification circuit.

In an arrangement of the pre-amplifier "adjacent to" the first detector, a distance between the detection surface and the pre-amplifier may be 5 cm or less, particularly 3 cm or less. Both the pre-amplifier and the first detector may be provided in a vacuum housing of the charged particle beam device, e.g. inside the column close to a downstream end thereof.

Fixedly mounting the pre-amplifier at a position close to the first detector may be understood as an essentially immovable positioning of the pre-amplifier at a position close to the first detector and is meant to distinguish from other solutions in which a BSE detector can be pivoted or otherwise moved toward and away from a detection position close to the sample in a sample chamber, i.e. outside of the column.

In some embodiments, the first detector 120 is an in-lens detector with a hole allowing a passage of the primary charged particle beam and with a detection surface that at least partially surrounds the hole. The first detector may include a support arranged between the objective lens and the proxy electrode or mounted at the objective lens or integrated therewith, wherein the preamplifier may be mounted on the support, particularly fixedly mounted on the support. More specifically, the first detector may include a semiconductor detector with a detection surface, and the pre-amplifier may be arranged inside the vacuum housing of the charged particle beam device at a distance of 3 cm or less from the detection surface. The first detector may include a plurality of detector segments, and the pre-amplifier may be a multi-channel pre-amplifier. Each detector segment may be associated to a respective amplification channel, such that the signals of the detector segments can be individually amplified before evaluation.

As explained above, integrating the pre-amplifier with the first detector and/or fixedly mounting the pre-amplifier at a support of the first detector adjacent to the first detector considerably improves the collection efficiency and the detection speed.

Figure 5:
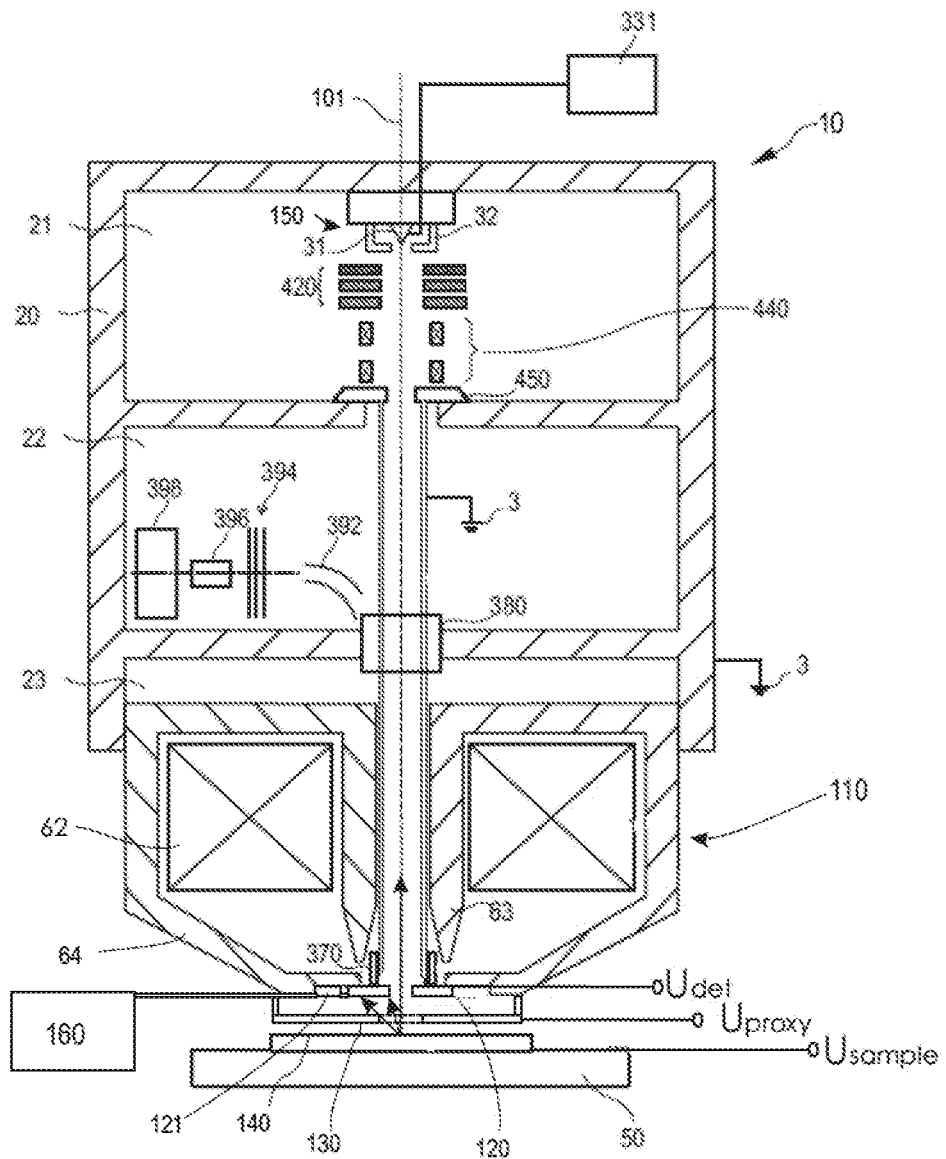
FIG. 5 is a schematic view of a charged particle beam device according to embodiments described herein.

FIG. 5 shows a charged particle beam device 10, such as an SEM imaging apparatus, i.e. a wafer imaging system. The column 20 of the charged particle beam device may provide a first chamber 21, a second chamber 22 and a third chamber 23. The first chamber, which can also be referred to as a gun chamber, includes the beam emitter 150 having a particle emitter 31 and a suppressor 32. The retarding field device 110 may be accommodated in the third chamber, and the proxy electrode 130 may be provided at a front end of the column 20.

According to some embodiments described herein, the particle emitter 31 is connected to a power supply 331 for providing a voltage to the particle emitter. In some examples described herein, the potential provided to the particle emitter is such that the charged particle beam is accelerated to an energy of 20 keV or above. Accordingly, typically the particle emitter is biased to a potential of −20 keV or higher negative voltages. As described above, having the particle emitter 31 on a negative potential is a typical embodiment with the benefits that the column and the beam guiding tube can be at ground or at a moderate potential.

The primary charged particle beam is generated by the beam emitter 150, e.g. a primary electron beam. In the example of FIG. 5, the beam is aligned to the beam limiting aperture 450, which is dimensioned to shape the beam, i.e. blocks a portion of the beam. The beam may then pass through the beam separator 380, which separates the primary electron beam from the secondary electrons (and, as the case may be, the axial backscattered electrons). The primary electron beam is focused on the sample 140 by the objective lens. The sample may be positioned on a sample stage 50. On impingement of the primary electron beam, for example, secondary or backscattered electrons are released from the sample 140. A second detector 398 may detect the secondary electrons and/or axially backscattered electrons and may be denoted as a second detector herein.

According to some embodiments, which can be combined with other embodiments described herein, a condenser lens system 420 and a beam shaping or beam limiting aperture 450 are provided. A two-stage deflection system 440 may be provided between the condenser lens system 420 and the beam limiting aperture 450 for alignment of the beam to the aperture.

As is shown in FIG. 5, the objective lens has a magnetic lens component having pole pieces 64/63 and a coil 62, which focuses the primary electron beam on the sample 140. The objective lens shown in FIG. 5 includes the upper pole piece 63, the lower pole piece 64 and the coil 62 forming a magnetic lens component of the objective lens. One or more electrodes may be provided for forming an electrostatic lens component of the objective lens. According to some embodiments described herein, the magnetic lens component and the electrostatic lens component substantially overlap with each other to form a compound lens, also referred to herein as a "retarding field device" that also includes the proxy electrode 130 arranged close to the sample.

Further, a scanning deflector assembly 370 may be provided. The scanning deflector assembly 370 can be a magnetic or an electrostatic scanning deflector assembly, which is configured for high pixel rates. According to typical embodiments, which can be combined with other embodiments described herein, the scanning deflector assembly 370 can be a single stage assembly as shown in FIG. 5. Alternatively, a two-stage or even a three-stage deflector assembly can be provided. Each stage may be provided at a different position along the optical axis 101.

According to some embodiments, secondary and/or axially backscattered electrons are extracted from the sample and are accelerated by the retarding field device. The beam separator 380 separates the primary electron beam from the signal electrons. The beam separator can be a Wien filter and/or can be at least one magnetic deflector, such that the signal electrons are deflected away from the optical axis 101. The signal electrons may then be guided by a beam bender 392, e.g. a hemispherical beam bender, and a lens system 394 to the second detector 398. Further elements like a filter 396 can be provided. According to some embodiments, the second detector 398 can be a segmented detector configured for detecting signal electrons depending on the starting angle at the sample.

According to embodiments described herein, the proxy electrode 130 is provided at a position close to the sample, the proxy electrode being configured in accordance with any of the embodiments described herein, such that reference can be made to the above explanations, which are not repeated here.

The charged particle beam device shown in FIG. 5 further includes the first detector 120 for detecting off-axially backscattered particles (e.g. electrons) having passed through the one opening of the proxy electrode 130. The first detector 120 (e.g. a scintillator, pin diode, or other electron sensitive device) may have different shapes according to the intended applications. For instance, if only a total backscattered particle signal is of interest, a ring detector may be provided. According to some embodiments, for topography contrast detection, a 4-quandrant detector may be a possible choice. In some embodiments, different ring zones (which might be additionally segmented) may be used to detect specific parts of the angular backscattered particle distribution (such as angular and polar segmentation). By detecting specific parts of the angular distribution of the backscattered particles, depth information can be gathered. Gathering depth information enables the gathering of 3-D information of the composition of the sample (in particular structures with a high aspect ratio). By combining the detection of the angular distribution of the backscattered particles with varying landing energies of the primary charged particle beam, a sample tomography can be achieved.

According to some embodiments, a tunable energy supply for the primary charged beam may be provided. Generally, the energy of the primary charged particle beam is chosen high enough so that backscattered particles from an interesting depth can penetrate the surroundings (such as walls of a structure of the sample). On the other hand, the energy of the primary charged particle beam is chosen so as not to be too high to avoid penetration into the deeper sample layers and reduce signal to noise ratio by unwanted depth information.

The potentials of the emitter, the column and the electrodes can be provided in the system according to any of the embodiments described herein. As a typical example, the beam guiding tube (also referred to as the "column" herein) may be on ground potential. Accordingly, the electrons travel through the column, which is on ground potential. The housing of the column can be provided on ground potential. The housing being on ground potential is indicated by reference numerals 3 in FIG. 5.

Figure 6:
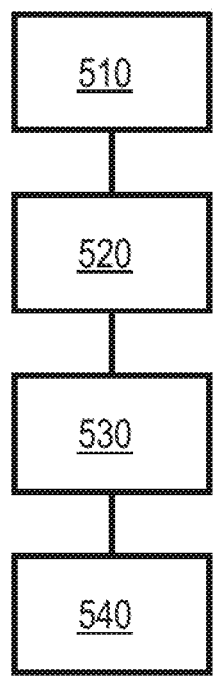
FIG. 6 shows a flow chart of a method for imaging and/or inspecting a sample with a charged particle beam device according to embodiments described herein.

FIG. 6 shows a flow chart of a method of inspecting and/or imaging a sample with a charged particle beam according to embodiments described herein. The sample is inspected and/or imaged by a charged particle beam being provided by a charged particle beam device having a column, an optical axis, and a sample stage for supporting a sample during imaging and/or inspection as described herein.

The method includes, in box 510, emitting a primary charged particle beam. The beam may be emitted by a beam emitter, particularly by an electron source. The method includes, in box 520, guiding the primary charged particle beam in the column of the charged particle beam device along an optical axis to the sample for generating signal particles, particularly including backscattered and secondary particles. Optical elements may be provided for guiding and/or shaping the primary charged particle beam from the beam emitter to the sample. FIG. 5 shows examples of optical elements, such as a condenser lens system, an aperture, a beam separator, and the like. The skilled person will understand that the charged particle beam device may include additional or alternative optical elements, e.g. depending on the planned applications or operations modes, the sample, the structures to be inspected and/or imaged, the energy used for the primary charged particle beam and the like.

The method further includes, in box 530, focusing and retarding the primary charged particle beam with a retarding field device including an objective lens and a proxy electrode arranged between the objective lens and the sample, wherein the proxy electrode may include one opening allowing a passage of the primary charged particle beam and of the signal particles.

Retarding the primary charged particle beam may be performed in an above mentioned range, such as retarding the primary beam to a landing energy on the sample of about 10 keV or less, e.g. 5 keV or less, such as 1 keV. Typically, the retarding field device includes a magnetic-electrostatic objective lens and a proxy electrode between the magnetic-electrostatic objective lens and the sample stage. The primary charged particle beam passes through the one opening of the proxy electrode. The one opening of the proxy electrode is sized to allow a passage of charged particles backscattered from the sample at angles from 0° to 20° or above relative to the optical axis.

The primary charged particle beam—after having passed the one opening of the proxy electrode—impinges on the sample and causes signal particles (such as secondary particles and backscattered particles) to leave the sample, in particular in the direction away from the sample. The backscattered particles may include axially and small-angle backscattered particles and large-angle backscattered particles. Both the axially backscattered particles and off-axially backscattered particles may propagate through the one opening of the proxy electrode allowing a passage of backscattered particles from 0° to 20° or above relative to the optical axis.

The method further includes, in box 540, detecting off-axial backscattered particles with the first detector that is arranged between the proxy electrode and the objective lens. Optionally, secondary particles released from the sample and propagating through the hole of the first detector may be detected by a second detector. For instance, the second detector may be arranged after the objective lens in a travelling direction of the secondary particles. According to some embodiments, the first detector and/or the second detector may be detectors as described in detail above.

In implementations, the signal of the first detector may be pre-amplified with a pre-amplifier mounted adjacent to the first detector in a vacuum environment of the charged particle beam device, particularly in the vacuum housing that is provided by the column. The pre-amplifier may be at least one or more of (i) integrated with the first detector, e.g. by being provided on a common support with the first detector, (ii) arranged at a distance of 3 cm or less from a detection surface of the first detector inside the vacuum housing of the charged particle beam device, and (iii) fixedly mounted in the vacuum housing of the charged particle beam device. In some implementations, the first detector includes a support, e.g. a plate, extending between the objective lens and the sample or mounted at the objective lens, and the pre-amplifier is mounted on the support.

In some embodiments, a potential difference between the proxy electrode and the column of the charged particle beam device may be between 3 keV and 35 keV for decelerating the primary charged particle beam before impingement on the sample. In particular, the first detector may act as a further electrode that is set essentially on the potential of the column. In particular, both the column and the first detector may be essentially grounded. In some implementations, a potential difference between the proxy electrode and the further electrode may be between 3 keV and 35 keV.

In some embodiments, which can be combined with other embodiments described herein, a signal of the first detector may be amplified with a pre-amplifier that is mounted adjacent to the first detector in a vacuum environment in the charged particle beam device, particularly inside the column of the charged particle beam device. The pre-amplified signal of the first detector may then be guided to a signal amplification and evaluation module that may be arranged outside of the vacuum housing of the charged particle beam device. The signal amplification and evaluation module may evaluate the pre-amplified signal to obtain spatial information about the sample, particularly for inspecting and/or imaging the sample.

In some embodiments, at least one or more of the following distances are provided during the sample inspection: A first distance D1 between the sample and the proxy electrode may be 200 μm or more and 3 mm or less. A second distance D2 between the proxy electrode and the first detector may be 3 mm or more and 6 mm or less, particularly 4 mm or more and 5 mm or less. A third distance D3 between the sample and the first detector may 3 mm or more and 10 mm or less, particularly 4 mm or more and 9 mm or less.

While the foregoing is directed to embodiments, other and further embodiments may be devised without departing from the basic scope, and the scope thereof is determined by the claims that follow.

The invention claimed is:

1. A charged particle beam device for imaging and/or inspecting a sample, comprising: a beam emitter for emitting a primary charged particle beam, the charged particle beam device adapted for guiding the primary charged particle beam along an optical axis to the sample for releasing signal particles; a retarding field device for retarding the primary charged particle beam before impinging on the sample, the retarding field device comprising an objective lens and a proxy electrode; and a first detector for off-axial backscattered particles between the proxy electrode and the objective lens, wherein the proxy electrode comprises one single opening that is centrally intersected by the optical axis, allowing a passage of the primary charged particle beam and of the signal particles including axial backscattered particles and the off-axial backscattered particles, wherein the one opening is sized to allow a passage of the charged particles backscattered from the sample at angles of at least 20 degrees relative to the optical axis.

2. The charged particle beam device according to claim 1, wherein the one single opening is sized to allow a passage of charged particles backscattered from the sample at angles of at least 45 degrees relative to the optical axis.

3. The charged particle beam device according to claim 1, wherein the first detector is an in-lens detector with a hole allowing a passage of the primary charged particle beam and has an annular detection surface sized for detecting at least charged particles backscattered from the sample at angles between 15° and 30°.

4. The charged particle beam device according to claim 3, wherein the annular detection surface is segmented and includes at least four detection segments.

5. The charged particle beam device according to claim 1, wherein the first detector is configured to act as a further electrode arranged between the objective lens and the proxy electrode for influencing at least one of the primary charged particle beam and the signal particles.

6. The charged particle beam device according to claim 5, wherein the first detector comprises at least one of a conductive inner surface directed toward the optical axis and a conductive top surface configured to be set on a predetermined electric potential.

7. The charged particle beam device according to claim 5, wherein the further electrode provided by the first detector is configured to be set on a ground potential.

8. The charged particle beam device according to claim 1, further comprising a pre-amplifier for amplifying a signal of the first detector.

9. The charged particle beam device according to claim 8, wherein the pre-amplifier is at least one of integrated with the first detector, arranged adjacent to the first detector inside a vacuum housing of the charged particle beam device, and fixedly mounted in a vacuum housing of the charged particle beam device.

10. The charged particle beam device according to claim 8, wherein the pre-amplifier is mounted on a support of the first detector.

11. The charged particle beam device according to claim 8, wherein the first detector comprises a semiconductor detector, particularly a PIN diode, that is connected to the pre-amplifier in a vacuum housing of the charged particle beam device.

12. The charged particle beam device according to claim 1, wherein the one single opening is a round or circular opening.

13. The charged particle beam device according to claim 1, further comprising a second detector for secondary charged particles released from the sample, the second detector provided downstream of the objective lens in a travelling direction of the secondary charged particles.

14. The charged particle beam device according to claim 1, wherein the beam emitter is adapted for emitting a primary electron beam, the charged particle beam device further comprising:

a sample stage for supporting the sample; and electron beam optical devices for guiding the primary electron beam along the optical axis to the sample for generating secondary electrons and backscattered electrons.

15. A charged particle beam device for imaging and/or inspecting a sample, comprising: a beam emitter for emitting a primary charged particle beam, the charged particle beam device adapted for guiding the primary charged particle beam along an optical axis to the sample for releasing signal particles; a retarding field device for retarding the primary charged particle beam before impinging on the sample, the retarding field device comprising an objective lens and a proxy electrode, wherein the proxy electrode comprises an opening allowing a passage of the primary charged particle beam and of the signal particles; and a first detector for off-axial backscattered particles between the proxy electrode and the objective lens, wherein the first detector is configured to act as a further electrode for influencing the primary charged particle beam and comprises at least one of a conductive inner surface directed toward the optical axis and a conductive top surface configured to be set on a predetermined electric potential.

16. A method for imaging and/or inspecting a sample with a charged particle beam device, comprising: emitting a primary charged particle beam; guiding the primary charged particle beam along an optical axis to the sample for generating signal particles; focusing and retarding the primary charged particle beam with a retarding field device comprising an objective lens and a proxy electrode arranged between the objective lens and the sample, wherein the proxy electrode comprises one single opening centrally intersected by the optical axis and allowing a passage of the primary charged particle beam and of the signal particles including axial backscattered particles and off-axial backscattered particles, wherein the one opening is sized to allow a passage of charged particles backscattered from the sample at angles of at least 20 degrees relative to the optical axis; and detecting the off-axial backscattered particles with a first detector arranged between the proxy electrode and the objective lens.

17. The method according to claim 16, wherein a potential difference between the proxy electrode and a column of the charged particle beam device is between 3 keV and 35 keV for decelerating the primary charged particle beam before impingement on the sample.

18. The method according to claim 17, wherein the first detector acts as a further electrode that is set essentially on a potential of the column, particularly wherein a potential difference between the proxy electrode and the further electrode is between 3 keV and 35 keV.

19. The method according to claim 16, further comprising:
pre-amplifying a signal of the first detector with a preamplifier fixedly mounted adjacent to the first detector in a vacuum environment inside the charged particle beam device.

20. The method according to claim 16, wherein, at least one or more of the following distances are provided:
a first distance (D1) between the sample and the proxy electrode is 200 μm or more and 3 mm or less;
a second distance (D2) between the proxy electrode and the first detector is 3 mm or more and 6 mm or less;
a third distance (D3) between the sample and the first detector is 3 mm or more and 10 mm or less.

\* \* \* \* \*